(12) United States Patent
Lifka et al.

(10) Patent No.: US 8,004,188 B2
(45) Date of Patent: Aug. 23, 2011

(54) LIGHT EMITTING DEVICE WITH ANODIZED METALLIZATION

(75) Inventors: Herbert Lifka, Eindhoven (NL); Cornelis Adrianus Henricus Antonius Mutsaers, Eindhoven (NL); Edward Willem Albert Young, Maastricht (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/596,862

(22) PCT Filed: Apr. 21, 2008

(86) PCT No.: PCT/IB2008/051530
§ 371 (c)(1),
(2), (4) Date: Oct. 21, 2009

(87) PCT Pub. No.: WO2008/132665
PCT Pub. Date: Nov. 6, 2008

(65) Prior Publication Data
US 2010/0084963 A1 Apr. 8, 2010

(30) Foreign Application Priority Data

Apr. 27, 2007 (EP) .................................. 07107086

(51) Int. Cl.
*H05B 33/00* (2006.01)

(52) U.S. Cl. ............................. 313/509; 313/506; 445/23
(58) Field of Classification Search ................. None
See application file for complete search history.

(56) References Cited

U.S. PATENT DOCUMENTS

| 6,750,607 B2 * | 6/2004 | Huitema et al. ............. 313/500 |
| 6,858,847 B1 | 2/2005 | Macciocchi |
| 2006/0046476 A1 | 3/2006 | Nakamura et al. |

FOREIGN PATENT DOCUMENTS

| EP | 1331666 A2 | 7/2003 |
| EP | 1555856 A2 | 7/2005 |
| JP | 2003255857 A | 9/2003 |
| JP | 2004134282 A | 4/2004 |
| WO | 2004107467 A1 | 12/2004 |
| WO | 2005053053 A1 | 6/2005 |

\* cited by examiner

*Primary Examiner* — Ashok Patel

(57) ABSTRACT

A light emitting device (100) is provided, comprising a substrate (101), a first electrically conductive layer (102), a light emitting layer (103), and a second electrically conductive layer (104). The light emitting device (100) further comprises at least one metal shunt (105) which is in electrical contact with said first electrically conductive layer (102). The at least one metal shunt (105) is isolated from said second electrically conductive layer (104) at least by means of a dielectric oxide layer (106). The present invention allows for the use of electrically insulating material between one or more metal shunts and a cathode layer without reducing the effective pixel area of the device.

12 Claims, 3 Drawing Sheets

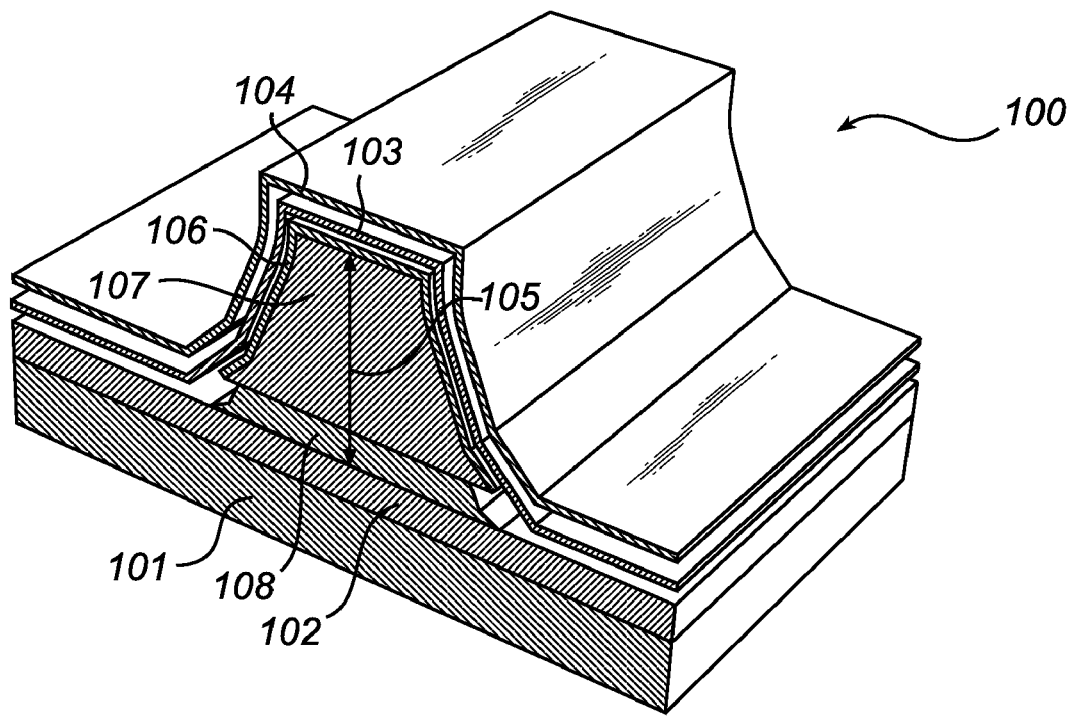
Fig. 1
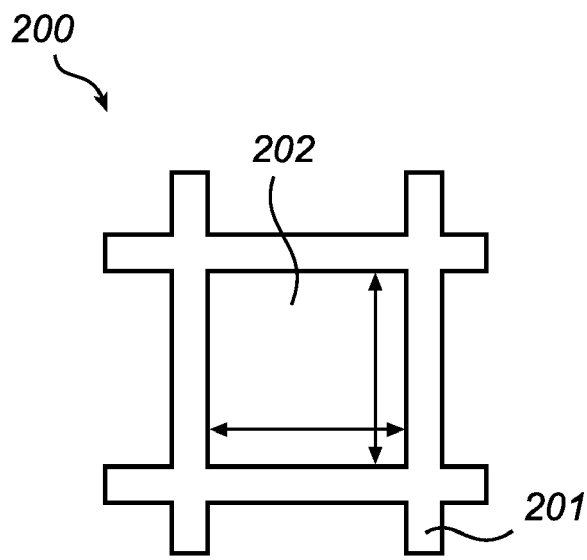
Fig. 2a
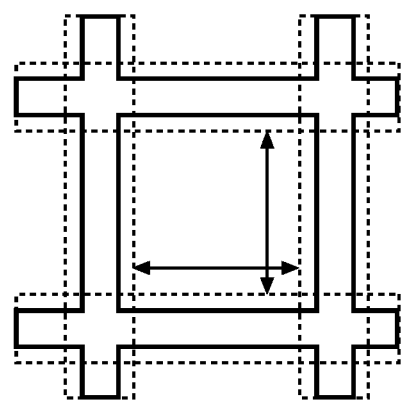
(Prior art) Fig. 2b

LIGHT EMITTING DEVICE WITH ANODIZED METALLIZATION

FIELD OF THE INVENTION

The present invention relates to a light emitting device comprising a substrate, a first electrically conductive layer, a light emitting layer, and a second electrically conductive layer. The light emitting device further comprises at least one metal shunt which is in electrical contact with the first electrically conductive layer. The invention also relates to a method of manufacturing such a light emitting device.

BACKGROUND OF THE INVENTION

Due to their high resolution, high quality images and independence from backlight sources, organic light emitting diodes (OLEDs) have attracted considerable attention in display and lighting applications.

An OLED electrically excites fluorescent or phosphorescent organic compounds to emit light. OLEDs may be either passive-matrix type or active-matrix type, depending upon the method utilized to drive the display pixels, which are arranged in a matrix.

While being commercially successful in small area applications, such as cell phone displays, large area organic devices have met technical difficulties. Since the anode and cathode layers are thin-films having limited electrical conductivity, they are not able to carry high current without substantial energy loss. This problem is further accentuated when one of the electrode layers also has to be optically transparent to allow light to pass. For OLED lamps this problems is even more relevant since they operate at relatively high currents.

In order to solve this problem, metal shunts can be introduced which compensate for the energy loss and serve as means for guiding and accelerating the propagation of the discharge.

Typically, metal shunts are separated from the cathode layer by means of an insulating resist layer.

Such an arrangement is disclosed in WO 2005/053053. This application relates to a light emitting device comprising a stack of substrate layers, an anode layer, a light emitting layer, a cathode layer, patterned metal shunts, and an etch-protective layer. Cathode isolation resist lines are arranged on the metal shunts which together define the pixel pattern of the device.

Although the invention disclosed in WO 2005/053053 solves a different problem, it illustrates a consequence of using resists to isolate metal shunts from a cathode layer. In order to function as electrically insulating layers, the resist layers arranged on top of the metal shunts need to extend over a larger surface than the top surface of the metal shunts. The result is that the effective pixel area, i.e. light transmitting surface, defined in between the shunts, is reduced Thus, there is a need in the art to provide a light emitting device comprising metal shunt(s) which can be isolated from the cathode without reducing the effective pixel area.

SUMMARY OF THE INVENTION

An object of the present invention is to at least partly overcome the above-mentioned problems and to fulfill the need in the art.

Especially, it is an object of the present invention to provide a light emitting device which allows for the use of electrically insulating material between the metal shunts and the cathode without reducing the effective pixel area of the device.

Thus, in a first aspect, the present invention relates to a light emitting device comprising a substrate, a first electrically conductive layer, a light emitting layer, and a second electrically conductive layer.

The device of the present invention further comprises at least one metal shunt which is in electrical contact with the first electrically conductive layer. The metal shunt is isolated from the second electrically conductive layer at least by means of a dielectric oxide layer. The dielectric oxide layer works as an electrically insulating layer which isolates the metal shunt(s) from the second electrically conductive layer and prevents short-circuit from occurring in the device.

Upon application of a voltage to the first and second electrically conductive layers, light is emitted from the light emitting layer and radiates from the device through the first electrically conductive layer and the substrate.

The metal shunt comprises a first metal layer which is covered by the dielectric oxide layer. The dielectric oxide layer may be an oxide layer which is formed from the first metal layer of the metal shunt.

In preferred embodiments, the dielectric oxide layer is formed by anodizing the first metal layer of the shunt. Anodizing the metal layer allows for a self-aligned formation of a uniform oxide layer extending over the entire surface of the first metal layer. As a result, the pixel area, i.e. the light emitting area defined in between the pattern of metal shunts is increased.

The first metal layer of the metal shunt may comprise a material selected from e.g. aluminum, zirconium, titanium and gallium. Such materials are capable of being anodized allowing for the formation of a dielectric metal oxide layer which may work as an electrically insulating layer in light emitting devices comprising metal shunts. Such metals are also good electrically conductive metals which maintain stable voltage breakdown and electrical resistance characteristics.

Preferably, the metal shunt further comprises at least one additional metal layer which is arranged to improve the electrical contact between the first electrically conductive layer and the metal shunt. Examples of metals to be used include molybdenum, aluminum, chromium, titanium nitride, copper, silver, gold, tungsten, zirconium, titanium, hafnium, or combinations or alloys thereof. Such metals are electrochemically stable and will protect the first electrically conductive layer from deteriorating upon exposure to the oxidized first metal layer.

In alternative embodiments, the light emitting device comprises a first and a second metal shunt. In such embodiments, the first metal shunt is in electrical contact with the first electrically conductive layer and the second metal shunt is in electrical contact with the second electrically conductive layer. This way the first metal shunt can be used to shunt the first electrically conductive layer and the second metal shunt to shunt the second electrically conductive layer.

When the light emitting device comprises two metal shunts, the second metal shunt is preferably arranged on top of the first metal shunt. The shunts are separated from each other by means of a second dielectric layer.

The second dielectric layer is used to electrically insulate the first metal shunt from the second, thereby isolating the first and the second electrically conductive layers from each other. Examples of materials to be used as the second dielectric layer are $SiO_2$, $Si_3N_4$, $Al_2O_3$.

In a second aspect, the present invention relates to a method for manufacturing a light emitting device of the above described type. The method comprises:

a. providing a substrate;
b. arranging a first electrically conductive layer on the substrate;
c. arranging a first metal layer on the substrate or on the first electrically conductive layer;
d. patterning the first metal layer to form at least one metal shunt;
e. forming a dielectric oxide layer on the first metal layer of the metal shunt;
f. arranging a light emitting layer on the first electrically conductive layer; and
g. arranging a second electrically conductive layer on the light emitting layer.

The method may be carried out in the order of the steps a-b-c-d-e-f-g. Alternatively, the method can be carried out in the order of the steps a-c-d-e-b-f-g.

In preferred embodiments, the method for manufacturing a light emitting device further comprises the step of arranging at least one additional metal layer on the substrate or, where applicable, on the first electrically conductive layer, prior to step c.

Furthermore, the method may comprise a step of patterning the additional metal layer(s) by using the dielectric oxide layer formed in step e as a mask for etching the additional metal layer(s).

Preferably, the dielectric oxide layer formed in said step e is formed by anodizing the first metal layer of the metal shunt. Anodizing is advantageous as it allows for a self-aligned oxide layer formation, and thus, no extra alignment step is required in the process. In addition, the thickness of the oxide layer may be controlled.

These and other aspects of the invention will be apparent from and elucidated with reference to the embodiment(s) described hereinafter.

BRIEF DESCRIPTION OF THE DRAWINGS

FIG. 1 illustrates one embodiment of a light emitting device according to the present invention.

FIG. 2a is a top view of part of a light emitting device according to the invention.

FIG. 2b is a top view of part of a light emitting device according to conventional light emitting devices using resists as electrically insulating materials.

DETAILED DESCRIPTION OF THE EMBODIMENTS

Figure 3:
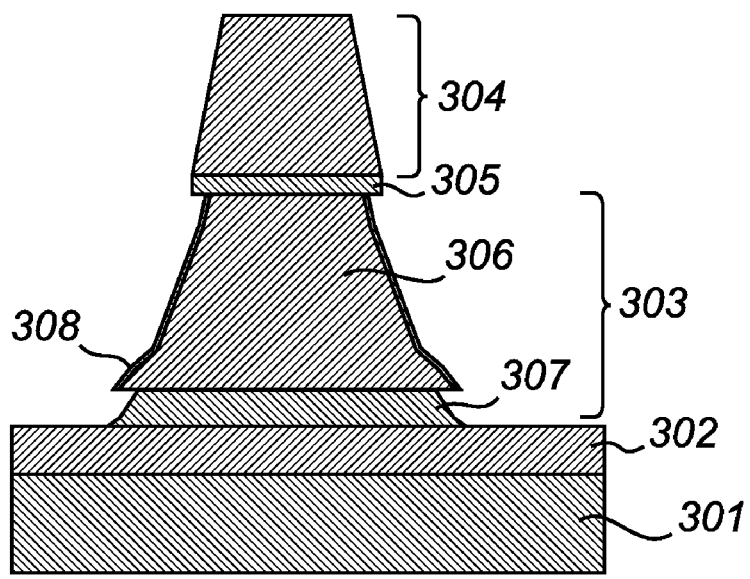
FIG. 3 illustrates a light emitting device comprising two metal shunts, representing an alternative embodiment of the present invention.

In one aspect, the present application relates to a light emitting device, and in another aspect it relates to a method for manufacturing such a device.

One embodiment of a light emitting device 100 according to the present invention is illustrated in FIG. 1, and comprises a substrate 101, a first electrically conductive layer 102, a light emitting layer 103, and a second electrically conductive layer 104. The light emitting device also comprises at least one metal shunt 105 which is in electrical contact with the first electrically conductive layer 102.

The metal shunt 105 is isolated from the second electrically conductive layer 104 at least by means of a dielectric oxide layer 106.

When a voltage is applied, current starts flowing through the device 100. The direction of the current flow is from the first electrically conductive layer 102 to the second electrically conductive layer 104. Accordingly, negatively charged electrons move from the second electrically conductive layer 104 into the light emitting layer 103. At the same time, positive charges, typically referred to as holes, move from the first electrically conductive layer 102 into the light emitting layer 103. When the positive and negative charges meet, they recombine and produce photons (light).

The substrate 101 and the first electrically conductive layer 102 are transparent to the photons generated, and light will be emitted from the organic light emitting device through the substrate 101, which may comprise e.g. glass.

In this embodiment, the first electrically conductive layer 102 serves as an anode layer, and the second electrically conductive layer 104 serves as a cathode layer. In alternative embodiments, the first electrically conductive layer serves as the cathode, and the second electrically conductive layer as the anode.

At least one of the first and the second electrically conductive layers, 102 and 104, are thin films with limited electrical conductivity. As a consequence they are not able to carry high current without substantial energy loss. This problem is further accentuated when one of the electrically conductive layers also has to be optically transparent to allow light to pass.

The metal shunt(s) 105 compensate for the energy loss and serve as means for guiding and accelerating the propagation of the discharge for a display device. Another purpose of the metal shunt(s) 105 is to reduce the line resistance of the first electrically conductive layer 102 and/or the second electrically conductive layer 104.

As used herein, the term "metal shunt" refers to a patterned metal layer or a patterned stack of several metal layers serving as a low-resistance connection between two points in an electric circuit. The metal shunts form an alternative path for a portion of the current.

The metal shunt 105 comprises a first metal layer 107 which is covered by the dielectric oxide layer 106.

Preferably, the dielectric oxide layer 106 is formed from the first metal layer 107. The formation of the oxide 106 is preferably accomplished by anodizing the first metal layer 107 such that a self-aligned uniform oxide layer 106 extending over the entire surface of the first metal layer 107 is obtained.

Since the dielectric oxide layer 106 is highly resistant to the flow of current, it will isolate the metal shunt 105 from the second electrically conductive layer 104, thereby preventing short circuit within the device 100.

FIG. 2a is a top-view of an organic light emitting device 200 according to the invention, which illustrates the advantages of using a dielectric oxide layer formed from anodizing the first metal layer of the metal shunt 201. As can be seen, a larger pixel area 202 is formed as compared to conventional organic light emitting devices using resists (dotted lines) as electrically insulating materials (FIG. 2b).

The first metal layer of the metal shunt should comprise a metal capable of being anodized. Examples of such metals are aluminum, zirconium, titanium and gallium. These metals have good electrically conductivity, and maintain stable voltage breakdown and electrical resistance characteristics. Preferably, the first metal layer of the metal shunt comprises aluminum.

In preferred embodiments of the invention, the metal shunt 105 comprises an additional metal layer 108 arranged to improve the electrical contact between the first electrically conductive layer 102 and the metal shunt 105.

Examples of metals to be used as additional layer(s) 108 have a good electrical conductivity and may be selected from e.g. molybdenum, aluminum, chromium, titanium nitride, copper, silver, gold, tungsten, zirconium, titanium, hafnium, or combinations or alloys thereof. These metals are electrochemically stable and protects the first electrically conductive layer 102 from deteriorating upon exposure to the oxidized first metal layer 107, which might be the case when only a first metal layer 107 is used in the shunt 105.

Preferably, the metal shunt 105 comprises a first metal layer 107 of aluminum and an additional metal layer 108 of TiN. Other preferred metals for 108 are molybdenum and chrome, which may be doped with other metals, e.g. molybdenum doped with chrome.

In alternative embodiments of the present invention, the organic light emitting device comprises two metal shunts. Such an embodiment is illustrated in FIG. 3, wherein a first metal shunt 303 is in electrical contact with a first electrically conductive layer 302, and a second metal shunt 304 is in electrical contact with a second electrically conductive layer (not shown). Hence, the first metal shunt 303 is used to shunt the first electrically conductive layer 302 and the second metal shunt 304 is used to shunt the second electrically conductive layer.

Preferably the second metal shunt 304 is arranged on top of the first metal shunt 303, and these are separated from each other by means of a second dielectric layer 305.

The second dielectric layer 305 electrically insulates the metal shunts 303 and 304 from each other, thereby isolating the first electrically conductive layer 302 from the second electrically conductive layer.

Examples of materials which may be used as the second dielectric layer in this embodiment may e.g. be selected from $SiO_2$, $Si_3N_4$ and $Al_2O_3$. Other materials for use as the second dielectric layer are known to those skilled in the art.

Preferably, in this embodiment, only the first metal shunt 303 comprises a dielectric oxide layer 308 formed from anodizing the first metal layer 306, since the second metal shunt 304 has to make electrical contact with the second electrically conductive layer. Preferably, at least part of the shunt 304 is not covered by a light emitting layer.

In an organic light emitting device of the present invention, the first electrically conductive layer may be an anode layer or a cathode layer. Accordingly, the second electrically conductive layer may be either a cathode layer or an anode layer. Preferably, the first electrically conductive layer is an anode layer, and the second electrically conductive layer is a cathode layer.

In embodiments, such as the one illustrated in FIG. 1, light emitted from the organic light emitting layer 103 is output perpendicularly downwards, and therefore the first electrically conductive layer 102 needs to be transparent to the light generated. Hence, the first electrically conductive layer should comprise a material with a good optical transmittance. Such materials include e.g. indium tin oxide (ITO), tin oxide (e.g. doped with fluor or antimony), zinc oxide (e.g. doped with aluminum), poly-ethylenedioxythiophene (PEDOT), indium zinc oxide, stacks of several electrically conductive metals. A number of materials and combinations of materials may be used in the first electrically conductive layer and these are known to those skilled in the art.

Preferably the first electrically conductive layer comprises ITO or PEDOT.

The second electrically conductive layer 104, which serves as a cathode layer in the embodiment of FIG. 1, may comprise a metal with a low work function, e.g. an alkali metal, an earth alkali metal, or alloys thereof. Several materials which may be used in the second electrically conductive layer are known to those skilled in the art.

In the present invention, the light emitting layer 103, comprises a polymeric light emitting composition and/or an organic light emitting composition of low molecular weight. Suitable light emitting low molecular weight compositions or polymeric light emitting compositions are known to those skilled in the art.

Generally, the light emitting layer 103 exists as a multi-layer structure comprising an electron transport layer, an electroluminescent layer, and a hole transport layer. Upon application of an electrical current, the material of the light emitting layer 103 will radiate light generated by recombination of electrons and holes in the organic material.

In the case of a polymeric LED the light emitting layer 103 is mostly a two layer stack comprising a hole conductor and a light emitting polymer. However, the light emitting layer can include other layers, such as an evaporated organic hole blocking layer on the light emitting polymer.

In the case of a small molecule OLED the light emitting layer is more complex and may comprise: a hole injection layer, a hole transport layer, an emitting layer, a hole blocking layer, an electron transporting layer. It may also include additional layers, e.g. three different emitting layers to generate emission of white light.

In embodiments, additional layers may be provided between the substrate 101 and the first electrically conductive layer 102, e.g. to protect the device from water, ions etc.

Figure 4:
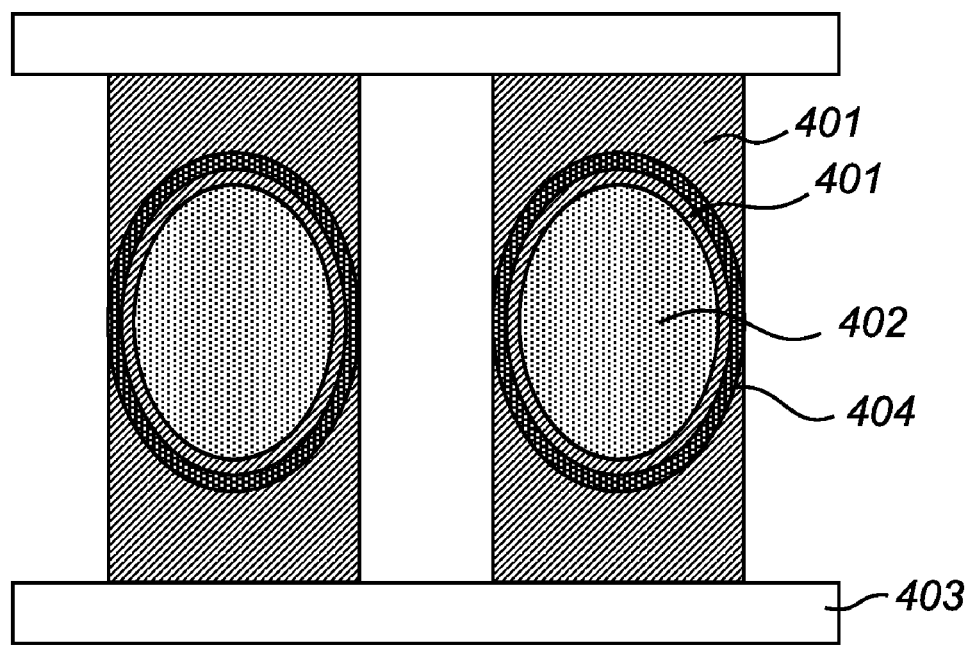
FIG. 4 is a top-view of a color pixel with anodized metal.

In FIG. 4 the advantages of the invention when used in display applications are illustrated. In conventional passive matrix displays, a separate dielectric layer is required at the edge of a pixel in order to achieve a good wetting behavior and to prevent short circuit within the device. The present invention using an anodized metal layer 401 instead of conventional dielectrics will also act as a short circuit preventor, but has the additional advantage of reducing the resistance towards the pixel while also increasing the effective pixel area 402. The effective pixel area is increased because no separate shunt is required anymore. Cathode isolation resist lines (build-in shadow mask) are designated 403, and hydrophobic dam lines are designated 404. The invention may of course also be used for other types of displays e.g. active matrix OLED displays.

The present invention also relates to a method for manufacturing an organic light emitting device of the above described kind This method comprises the steps of:

a. providing a substrate 101;

b. arranging a first electrically conductive layer 102 on the substrate 101;

c. arranging a first metal layer 107 on the substrate 101 or on the first electrically conductive layer 102;

d. patterning the first metal layer 107 to form at least one metal shunt 105;

e. forming a dielectric oxide layer 106 on the first metal layer 107 of said metal shunt 105;

f. arranging a light emitting layer 103 on the first electrically conductive layer 102; and g. arranging a second electrically conductive layer 104 on the light emitting layer 103.

In embodiments of the present invention, the method is carried out in the order of the steps a-b-c-d-e-f-g.

The steps a-c, and f-g of the method of the invention are not limited to a specific technique, but may be carried out by any suitable technique which is known to those skilled in the art.

For example, the light emitting layer 103 can be arranged on the first electrically conductive layer 102 by vacuum or wet process deposition techniques. The second electrically conductive layer 104 may be arranged on the light emitting layer 103 by e.g. a vacuum or sputtering process.

Referring again to FIG. 2, which illustrates a top view of an organic light emitting device, a preferred metal shunt pattern can be observed. The metal layer(s) are preferably patterned such that the shunts extend over the surface of the substrate or the first electrically conductive layer, thereby defining the pixel structure of the device. Techniques of patterning the metal layer(s) are known to those skilled in the art, for example commonly known sputtering and etching methods may be used.

In alternative embodiments, the method is carried out in the order of the steps a-c-d-e-b-f-g.

In preferred embodiments, the method comprises an additional step of arranging at least one additional metal layer 108 on the substrate 101 or on the first electrically conductive layer 102 prior to step c. This is to improve the electrical contact between the metal shunt 105 and the first electrically conductive layer 102. The arrangement of such metal layer(s) is known to those skilled in the art.

Figure 5A:
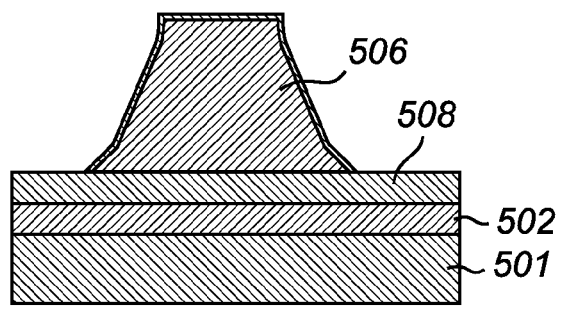
FIG. 5a illustrates a stage in the process of manufacturing a metal shunt for use in a light emitting device according to the invention.

The additional metal layer(s) 108 may be patterned by using the dielectric oxide layer 106, formed in step e, as a mask for etching the additional metal layer(s) 108. FIG. 5*a* illustrates a method stage in which the first metal layer 507 has been patterned by conventional methods, e.g. by etching using a photo mask. The additional layer(s) 508 is not yet patterned, but exists as a metal layer extending over the surface of the first electrically conductive layer 502.

Figure 5B:
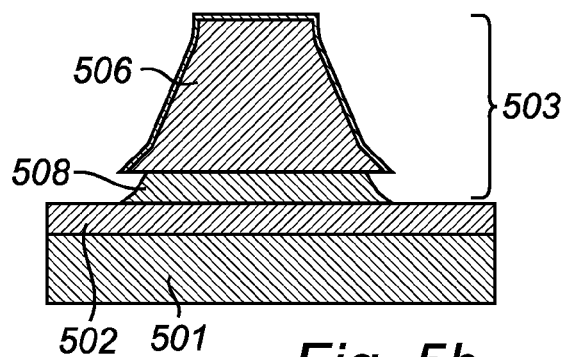
FIG. 5b illustrates a metal shunt comprising several metal layers which have been patterned using the dielectric oxide layer as an etching mask.

By using the dielectric oxide layer 506 as a mask, the additional layer(s) 508 may be etched resulting in a metal shunt 505 in accordance with the present invention (FIG. 5*b*).

In the method according to the present invention, the dielectric oxide layer 106 formed in said step e is formed by anodizing the first metal layer 107 of the metal shunt 105.

Anodizing is a well known technique used to coat the surface of a metal with an oxide layer. The first metal layer 107 of the metal shunt 105 is anodized by passing a current through a sulphuric acid solution with the first metal layer serving as an anode. The current releases hydrogen at the cathode and oxidizes the surface of the anode, resulting in a build-up of metal oxide. An advantage of using anodizing in creating a dielectric oxide layer 106 is that this process is self-aligned and does not require an extra alignment step, which often is the case when using e.g. resists. Thus, a dielectric oxide layer is homogenously arranged on the entire surface of the first metal layer 107.

Anodizing is also advantageous as it increases corrosion resistance and wear resistance of the device, allows dyeing, and prepares the surface for other processes and coatings.

The formed oxide layer 106 is dielectric and serves as an electrically insulating layer which prevents short-circuit from occurring in light emitting devices comprising metal shunts.

Several metals, e.g. aluminum, when exposed to the atmosphere forms a passive metal oxide layer, which provides moderate protection against corrosion. However, such a passive oxide layer is not thick enough to function as a dielectric layer.

The thickness of the dielectric oxide layer can range from 2 nanometers to over 25 micrometers. Preferably, the thickness of the dielectric oxide layer is from 20 to 100 nanometers.

Figure 6:
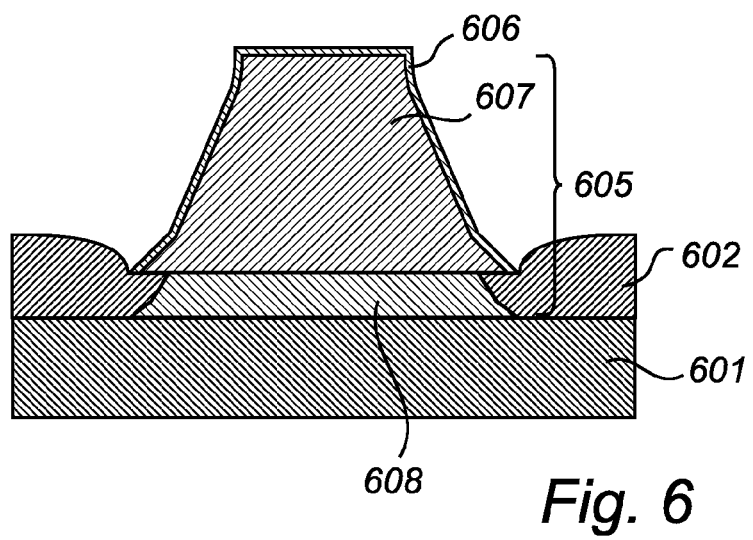
FIG. 6 illustrates an alternative embodiment of a light emitting device according to the present invention.

The embodiment of the method carried out in the order of the steps a-c-d-e-b-f-g is described by reference to FIG. 6, which illustrates an organic light emitting device 600 which has been manufactured in this latter order of steps. The light emitting layer and the second electrically conductive layer are not shown in this figure.

In this embodiment, the first metal layer 607, and, if applicable, the additional metal layer(s) 608 is (are) arranged directly on the substrate 601, and the first electrically conductive layer 602 is arranged on the substrate 601 after the first metal layer 607 and additional layer 608 have been patterned and 607 has been anodized.

When the first electrically conductive layer 602 is arranged, it should not attach to the dielectric oxide layer 606 surrounding the first metal layer 607 of the metal shunt 605 to a substantial degree. In order to avoid the first electrically conductive material 602 to "stick" to the shunt 605, a hydrophobic organic high temperature boiling (100-200° C.) solvent may be applied which fills the pores contained in the dielectric oxide layer.

Hence, the first electrically conductive layer 602 fills the areas in between several metal shunts, but will not substantially adhere to the dielectric layer 606 of the metal shunt 605.

In order to remove the organic solvent from the dielectric oxide layer 606, as well as water from the first electrically conductive layer 602, the device 600 can be baked at about 200° C.

The subsequent steps of arranging a light emitting layer and a second electrically conductive layer are carried out as described above.

In embodiments of the present invention, the method further comprises the step of patterning the first electrically conductive layer either after step b, d or e. As used herein, the "patterning the first electrically conductive layer" refers to structuring by means of e.g. etching, laser ablation, deposition through a shadow mask, printing etc.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. For example, the present invention is not limited to a specific technique carrying out the steps a-c, and f-g of the present inventive manufacturing method, but any technique may be used. Although anodizing is a preferred method for forming a dielectric oxide layer, the present invention is not limited thereto. Several other techniques to form such a dielectric oxide layer may be applied. Even though the light emitting device of the present invention is preferably an organic light emitting device it is not limited thereto. The light emitting device of the present invention may also be inorganic. When the device of the invention is organic, it is not limited to a specific organic or polymeric light emitting composition; but instead several possible compositions may be used.

The invention claimed is:

1. A light emitting device, comprising:
   a substrate,
   a first electrically conductive layer,
   a light emitting layer,
   a second electrically conductive layer;
   at least one metal shunt in electrical contact with said first electrically conductive layer, said at least one metal shunt comprising a first metal layer and being isolated from said second electrically conductive layer at least by a dielectric oxide layer, said at least one metal shunt further comprising an auxiliary metal layer arranged to facilitate the electrical contact between said first electrically conductive layer and said metal shunt, wherein said auxiliary metal layer comprises a metal selected from the group consisting of: molybdenum, aluminium, chromium, titanium nitride, copper, silver, gold, tungsten, zirconium, titanium, and hafnium.

2. A light emitting device according to claim 1, wherein said first metal layer of said at metal shunt is selected from the group consisting of: aluminium, zirconium, titanium and gallium.

3. A light emitting device according to claim 1, wherein said dielectric oxide layer is an oxide layer formed from said first metal layer of said metal shunt.

4. A light emitting device according to claim 1, wherein said dielectric oxide layer is formed by anodising said first metal layer of said metal shunt.

5. A light emitting device comprising:
   a substrate,
   a first electrically conductive layer,
   a light emitting layer,
   a second electrically conductive layer;
   first and second metal shunts in electrical contact with said first electrically conductive layer, said first and second metal shunts being isolated from said second electrically conductive layer at least by a dielectric oxide layer.

6. A light emitting device according to claim 5, wherein said first metal shunt is separated from said second metal shunt by a second dielectric layer.

7. A light emitting device according to claim 6, wherein said second dielectric layer is selected from the group consisting of $SiO_2$, $Si_3N_4$ and $Al_2O_3$.

8. A light emitting device according to claim 5, wherein said first metal shunt is in electrical contact with said first electrically conductive layer, and said second metal shunt is in electrical contact with said second electrically conductive layer.

9. A light emitting device according to claim 5, wherein said second metal shunt is arranged on top of said first metal shunt.

10. A method for manufacturing a light emitting device, comprising:
    a. providing a substrate;
    b. arranging a first electrically conductive layer on said substrate;
    c1 arranging an auxiliary metal layer on said substrate or said first electrically conductive layer;
    c2. arranging a first metal layer on said substrate or said first electrically conductive layer;
    d. patterning said first metal layer to form at least one metal shunt;
    e. forming a dielectric oxide layer on said first metal layer of said metal shunt;
    f. arranging a light emitting layer on said first electrically conductive layer; and
    g. arranging a second electrically conductive layer on said light emitting layer.

11. A method according to claim 10, further comprising the step of patterning said auxiliary metal layer(s) by using the dielectric oxide layer formed in step e as a mask for etching said auxiliary metal layer(s).

12. A method according to claim 10, wherein said dielectric oxide layer formed in said step e is formed by anodising said first metal layer of said metal shunt.

* * * * *